Jan. 26, 1965 W. F. NEWBOLD 3,167,647
ELECTRICAL ANALOG COMPUTING CIRCUIT WITH
SQUARE ROOT EXTRACTION CAPABILITY
Filed Aug. 15, 1961
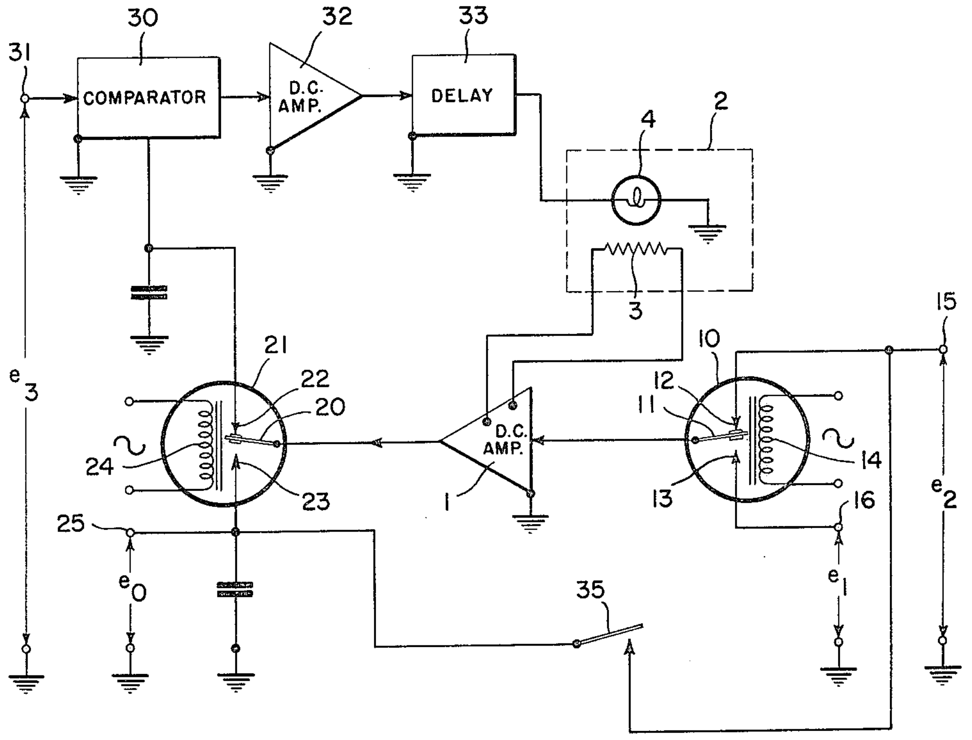
INVENTOR.
WILLIAM F. NEWBOLD
BY Arthur H. Swenson
ATTORNEY.

United States Patent Office 3,167,647

Patented Jan. 26, 1965

3,167,647

ELECTRICAL ANALOG COMPUTING CIRCUIT WITH SQUARE ROOT EXTRACTION CAPABILITY

William F. Newbold, Springfield Township, Montgomery County, Pa., assignor to Honeywell Inc., a corporation of Delaware Filed Aug. 15, 1961, Ser. No. 131,651
3 Claims. (Cl. 235—193)

This invention relates to computing circuits. More specifically, the present invention relates to analog computing circuits.

An object of the present invention is to provide an improved analog computing circuit for electrical signals.

Another object of the present invention is to provide an improved analog computing circuit for performing a multiplication or a division operation upon two electrical analog signals.

A further object of the present invention is to provide an improved analog computing circuit for performing a square-root extraction operation upon an electrical analog signal.

A still further object of the present invention is to provide an improved analog computing circuit, as set forth herein, which is characterized by a simplicity of operation and construction.

In accomplishing these and other objects, there is provided in accordance with the present invention, an analog computing circuit comprising a first direct-current signal amplifier having a photosensitive means arranged to vary the signal gain of the amplifier. The input signal to the amplifier is taken from the switch arm of a first single-pole, double-throw input switch which alternately applies a first and a second input signal to the amplifier. An output signal from the amplifier is applied to the switch arm of a second single-pole, double-throw switch operated synchronously with the first switch. One contact of the second switch is connected to an output signal terminal. The other contact of the second switch is connected to apply a signal as one input signal to a signal comparator for comparing the amplitudes of two signals. A second input signal for the comparator is obtained from a third input signal terminal. The output signal from the comparator is amplified by a second direct-current signal amplifier. A delayed output signal from the second amplifier is used to affect the aforesaid photosensitive circuit to control the gain of the first amplifier to reduce the output signal from the comparator to zero amplitude level.

A better understanding of the present invention may be had when the following detailed description is read in connection with the accompanying drawing, in which the single figure represents a schematic illustration of an analog computing circuit embodying the present invention.

Referring to the single figure in more detail, there is shown an analog computing circuit having a first direct-current amplifier 1. The amplifier 1 is arranged to have therein a photoelectric means 2 for varying the amplifier gain. The photoelectric means 2 may comprise a light-sensitive resistor 3 and a light source 4. The resistor 3 may be arranged as an output signal load in the amplifier 1 whereby to affect the amplifier output signal through changes in resistance of the resistor 3.

An input signal to the amplifier 1 is supplied by a single-pole, double-throw switch 10. The switch 10 has a switch arm 11, a first stationary contact 12, a second stationary contact 13 and a driving coil 14. The switch arm 11 is connected to the input circuit of the amplifier 1. The first contact 12 is connected to a first input terminal 15 and the second contact is connected to a second input terminal 16. An outdput signal from the amplifier 1 is connected to the switch arm 20 of a second single-pole, double-throw switch 21 having a first stationary contact 22, a second stationary contact 23 and a driving coil 24. The driving coils 14 and 24 are connected to the same energizing source in order to operate the switch arms 11 and 20 synchronously. The second contact 23 of the second switch 21 is connected to an output signal terminal 25. The first contact 22 of the second switch 21 is connected to an input circuit of a signal comparator 30. The signal comparator 30 may be any suitable device for comparing the amplitudes of two signals and producing an output signal proportional to the difference thereof, such devices being well-known in the art.

A second input signal for the comparator 30 is applied from a third input terminal 31. The comparator output signal is applied as an input signal to a second direct-current amplifier 32. The output signal from the amplifier 31 is delayed by a delay circuit 33 such as a suitable RC network and is applied as an energizing signal to the aforesaid light source 4. Thus, the output signal from the comparator 30 is used to control the intensity of the light falling on the light-sensitive resistor 3. A switch 35 is used to selectively connect the output terminal 25 to the first input terminal 15.

The operation of the present invention is as follows:

Assume similar polarity signals are applied to the first, second and third input terminals 15, 16 and 31, and the switch arms 11 and 20 are initially in the position shown in the single figure. In this position, the switch arm 11 is effective to apply the input signal at the first input terminal 15 to the first amplifier 1. This signal is amplified and is applied by the switch arm 20 to the comparator 30. The comparator 30 is effective to compare the amplified signal with the signal appearing at the third input terminal 31. An output signal from the comparator 30 representing the difference of these applied signals is applied through the delay 33 to affect the light source 4.

The light output of the light source 4 is arranged to affect the resistor 3 to control the output signal from the first amplifier 1. Further, this effect is arranged to reduce the difference between signals applied to the comparator 30. Thus, the output signal from the first amplifier 1 is made equal to the input signal applied to the third input terminal 31. The delay circuit 33 is used to delay the effect of the comparator signal until the switches 10 and 21 have been operated to the opposite position from that shown in the single figure. When the switches 10 and 21 are again in the illustrated position, the aforesaid comparison is repeated. The light output of the light source 4 is varied until the aforesaid difference signal at the comparator 30 is reduced to a zero level. At this time, the further operation of the switches 10 and 21 to the opposite position from that illustrated is effective to apply a final output signal to the output terminal 25. This output signal is the amplified representation of the input signal applied from the second input terminal 16 to the first amplifier 1 by the first switch 10. This input signal is amplified by the amplifier 1 to a level as determined by the effect of the photosensitive circuit 2. Thus, assuming $G_1$ is the gain of the first amplifier 1, $$e_0=G_1e_1$$

and $$e_3=G_1e_2$$

then $$G_1=\frac{e_3}{e_2}$$

and $$e_0=\frac{e_1e_3}{e_2}$$

Accordingly, it may be seen that $e_0$ is the product of two input signals divided by a third input signal. This operation may be modified by setting one of the input signals to be equal to unity or one. In this case, the unity signal has no consequent effect upon the output signal which output signal is equal to the mathematical relationship between the remaining signals. Another modification may be obtained by setting the output signal to be identical to the input signal on terminal 15. This may be accomplished by connecting the input terminal 15 to the output terminal 25 by the switch 35. Thus, since $e_0=e_2$ and $$e_0=\frac{e_1e_3}{e_2}$$

then $$e_0^2=e_1e_3$$

and $$e_0=\sqrt{e_1e_3}$$

if $$e_3=1$$

then $$e_0=\sqrt{e_1}$$

Thus, the output signal $e_0$ is the square root of the input signal applied at the second terminal 16.

Accordingly, it may be seen that there has been provided, in accordance with the present invention, an analog computing circuit for performing a multiplication, division or square-root extraction operation upon electrical signals applied thereto.

What is claimed is:

1. A computing circuit comprising a first amplifier means having a photoelectric gain control means, a first input signal terminal, a second input signal terminal, a first switch means for alternately connecting an input circuit of said amplifier means to said first and said second input terminals, signal comparison means for comparing the amplitudes of two input signals to produce a representative difference signal, a third input terminal for applying an input signal as one input signal to said comparator means, an output terminal, second switch means operated synchronously with said first switch means for alternately applying an output signal from said first amplifier means as a second input signal to said comparator means and as an output signal to said output terminals, means connecting said output terminal to said first input terminal, and means responsive to said comparator means to produce a control signal to affect said gain control means whereby to reduce said difference signal to a zero amplitude level.

2. A computing circuit as set forth in claim 1 wherein said photoelectric gain control means comprises a photosensitive resistor, means connecting said resistor as a load element in said first amplifier and a light source arranged to be energized by said control signal.

3. A computing circuit comprising a first direct-current amplifier having a photosensitive resistor connected as a signal load element in said amplifier, a light source arranged to illuminate said resistor in response to a control signal, a single-pole, double-throw switch having a switch arm and two stationary contacts, means connecting said switch arm to an input circuit of said amplifier, a first input terminal, a second input terminal, means connecting each of said contacts to a corresponding one of said first and said second terminals, a signal comparator circuit for comparing the amplitudes of two input signals to produce a representative difference signal, a third input terminal, means connecting said third input terminal to said comparator means as a source of a first input signal to be compared, an output terminal, a second single-pole, double-throw switch operated synchronously with said first switch means having a switch arm and two stationary contacts, means connecting said switch arm to an output circuit of said first amplifier, means connecting said output terminal to one of said contacts of said second switch, means connecting the other of said contacts of said second switch to said comparator as a source as a second input signal to be compared, and means responsive to said comparator means to produce a control signal to affect the energization of said light source whereby to reduce said difference signal to a zero amplitude level, said circuit including means connecting said output terminal to said first input terminal.

References Cited in the file of this patent

UNITED STATES PATENTS

| | | |
|---|---|---|
| 2,497,883 | Harris | Feb. 21, 1950 |
| 2,855,148 | Schroeder et al. | Oct. 7, 1958 |
| 2,966,306 | Isabeau | Dec. 27, 1960 |
| 3,030,022 | Gittleman | Apr. 17, 1962 |
| 3,057,555 | Case | Oct. 9, 1962 |
| 3,058,662 | Whitesell | Oct. 16, 1962 |